United States Patent
Zhang et al.

(10) Patent No.: US 11,997,911 B2
(45) Date of Patent: May 28, 2024

(54) METHOD FOR PREPARING QUANTUM DOTS LIGHT-EMITTING DIODE

(71) Applicant: TCL TECHNOLOGY GROUP CORPORATION, Guangdong (CN)

(72) Inventors: Jie Zhang, Guangdong (CN); Chaoyu Xiang, Guangdong (CN)

(73) Assignee: TCL TECHNOLOGY GROUP CORPORATION, Guangdong (CN)

( * ) Notice: Subject to any disclaimer, the term of this patent is extended or adjusted under 35 U.S.C. 154(b) by 452 days.

(21) Appl. No.: 17/419,694

(22) PCT Filed: Sep. 17, 2019

(86) PCT No.: PCT/CN2019/106135
§ 371 (c)(1),
(2) Date: Jun. 29, 2021

(87) PCT Pub. No.: WO2020/134202
PCT Pub. Date: Jul. 2, 2020

(65) Prior Publication Data
US 2022/0085343 A1    Mar. 17, 2022

(30) Foreign Application Priority Data
Dec. 29, 2018  (CN) .......................... 201811639610.0

(51) Int. Cl.
| | |
|---|---|
| *H10K 71/00* | (2023.01) |
| *C01G 9/08* | (2006.01) |
| *C01G 11/00* | (2006.01) |
| *C09K 11/56* | (2006.01) |
| *C09K 11/88* | (2006.01) |
| *H10K 50/115* | (2023.01) |

(Continued)

(52) U.S. Cl.
CPC ............... *H10K 71/00* (2023.02); *C01G 9/08* (2013.01); *C01G 11/00* (2013.01); *C09K 11/565* (2013.01);
(Continued)

(58) Field of Classification Search
CPC ... H10K 50/115; H10K 71/811; H10K 71/135
See application file for complete search history.

(56) References Cited

U.S. PATENT DOCUMENTS
| | | |
|---|---|---|
| 9,293,645 B2 | 3/2016 | Kim |
| 2006/0057310 A1 | 3/2006 | Suzuki et al. |

(Continued)

FOREIGN PATENT DOCUMENTS
| | | |
|---|---|---|
| CN | 101413209 A | 4/2009 |
| CN | 101428844 A | 5/2009 |

(Continued)

*Primary Examiner* — Evan G Clinton

(57) ABSTRACT

The present application discloses a method for preparing quantum dots light-emitting diode, including the following step: providing a base plate, placing the base plate into an inert atmosphere containing active gas, and printing quantum dots ink on a surface of the base plate to prepare a quantum dots light-emitting layer. The method for preparing the quantum dots light-emitting diode provided in the present application changes the film-forming atmosphere of inkjet printing, and prepares the quantum dots light-emitting layer in the inert atmosphere containing active gas, which can improve the device efficiency of the quantum dots light-emitting diode while ensuring the printability of quantum dots ink.

18 Claims, 1 Drawing Sheet providing a base plate, placing the base plate into an inert atmosphere containing active gas, and printing quantum dots ink on a surface of the base plate to prepare a quantum dots light-emitting layer — S01

(51) Int. Cl.
*B82Y 20/00* (2011.01)
*B82Y 40/00* (2011.01)
*H10K 50/15* (2023.01)
*H10K 50/16* (2023.01)

(52) U.S. Cl.
CPC .......... *C09K 11/883* (2013.01); *H10K 50/115* (2023.02); *B82Y 20/00* (2013.01); *B82Y 40/00* (2013.01); *C01P 2004/64* (2013.01); *C01P 2006/60* (2013.01); *H10K 50/157* (2023.02); *H10K 50/167* (2023.02)

(56) References Cited

U.S. PATENT DOCUMENTS

2017/0037314 A1    2/2017  Nam et al.
2021/0026193 A1*  1/2021  Yu .................... G02F 1/133516

FOREIGN PATENT DOCUMENTS

| | | | |
|---|---|---|---|
| CN | 101882665 | A | 11/2010 |
| CN | 102417202 | A | 4/2012 |
| CN | 105960684 | A | 9/2016 |
| CN | 106299159 | A | 1/2017 |
| CN | 106654016 | A | 5/2017 |
| CN | 106803546 | A | 6/2017 |
| CN | 107238973 | A | 10/2017 |
| CN | 107652776 | A | 2/2018 |
| CN | 107761052 | A | 3/2018 |
| JP | 2011189543 | A | 9/2011 |
| WO | 2014119543 | A1 | 8/2014 |
| WO | WO-2018225782 | A1 * | 12/2018 ............. C09D 11/32 |

* cited by examiner providing a base plate, placing the base plate into an inert atmosphere containing active gas, and printing quantum dots ink on a surface of the base plate to prepare a quantum dots light-emitting layer — S01

METHOD FOR PREPARING QUANTUM DOTS LIGHT-EMITTING DIODE

CROSS REFERENCE TO RELATED APPLICATION

The present application claims priority of Chinese Patent Application with Application No. 201811639610.0, titled "a method for preparing quantum dots light-emitting diode", filed on Dec 29, 2018 to CNIPA, the entire content of which is incorporated herein by reference.

TECHNICAL FIELD

The present application relates to the field of display technology, and more particularly to a method for preparing quantum dots light-emitting diode.

BACKGROUND

Quantum dots, also known as semiconductor nanocrystals, have three-dimensional dimensions in the nanometer range (1-100 nm), and belong to a kind of nanoparticle theory between bulk materials and molecules. The quantum dots have excellent optical properties such as high quantum yield, large molar extinction coefficient, good light stability, narrow half-width, wide excitation spectrum and controllable emission spectrum, and are very suitable for use as luminescent materials for light-emitting devices. In recent years, quantum dot fluorescent materials have been widely used in the field of flat panel displays due to their high light color purity, adjustable luminous color, and long service life, becoming a promising next-generation display and solid-state lighting source. Quantum dots light-emitting diodes (QLED) are light-emitting devices based on quantum dot materials as luminescent materials, which have become a strong competitor for the next generation of display technology due to their advantages such as adjustable wavelength, narrow emission spectrum, high stability, and high electroluminescence quantum yield.

However, the current method for preparing the quantum dots light-emitting diodes still needs to be improved.

TECHNICAL PROBLEM

The inventor found that the solution processing method is a common method for preparing QLED devices, especially with the development of technology, the using of inkjet printing technology to prepare quantum dots light-emitting layer has become routine. When the inkjet printing technology prepares the quantum dots light-emitting layer, the requirements for the quantum dots ink are relatively high. It is necessary to ensure that it has good printability and good solution stability. However, the efficiency of quantum dot light-emitting diode devices and ink printability are often difficult to balance, and the efficiency of ink devices with better printability is usually not high.

One of the objects of the embodiments of the present application is to provide a method for preparing a quantum dots light-emitting diode, which aims to solve the problem that the efficiency of the quantum dot light-emitting diode device and the ink printability are often difficult to balance when inkjet printing the quantum dots light-emitting layer, and low efficiency of ink devices with better printability.

SUMMARY

In order to solve above technical problem, the technical solution adopted in the embodiment of the present application as following:

A first aspect provides a method for preparing quantum dots light-emitting diode, including the following step:

providing a base plate, placing the base plate into an inert atmosphere containing active gas, and printing quantum dots ink on a surface of the base plate to prepare a quantum dots light-emitting layer.

In an embodiment, the active gas is one or a combination of two or more selected from a group consisting of saturated fatty acids, unsaturated fatty acids, esters, and organic bases.

In an embodiment, the saturated fatty acid is selected from a group consisting of butyric acid, caprylic acid, lauric acid, and stearic acid;

the unsaturated fatty acid is selected from a group consisting of acrylic acid, crotonic acid, methacrylic acid, and 3-pentenoic acid;

the ester is selected from a group consisting of methyl methacrylate, ethyl crotonate, ethyl acetate, and methyl benzoate;

the organic base is selected from a group consisting of ethanolamine, tetramethylammonium hydroxide, aniline, and triethanolamine In an embodiment, the active gas accounts for 0.01%-20% of a molar percentage of the overall gas atmosphere.

In an embodiment, the active gas accounts for 0.01%-15% of a molar percentage of the overall gas atmosphere.

In an embodiment, the active gas accounts for 0.1%-3% of a molar percentage of the overall gas atmosphere.

In an embodiment, the active gas is a combination of two or more selected from a group consisting of the saturated fatty acids, the unsaturated fatty acids, the esters, and the organic bases.

In an embodiment, the active gas is a mixed active gas composed of at least one selected from unsaturated fatty acids and at least one selected from the organic bases.

In an embodiment, the steps of placing the base plate into an inert atmosphere containing active gas, and printing quantum dots ink on a surface of the base plate to prepare a quantum dots light-emitting layer are performed under a condition of a temperature ranged from 10° C. to 80° C.

In an embodiment, the steps of placing the base plate into an inert atmosphere containing active gas, and printing quantum dots ink on a surface of the base plate to prepare a quantum dots light-emitting layer are performed under a condition of a temperature ranged from 30° C. to 50° C.

In an embodiment, the inert atmosphere is a helium atmosphere, a neon atmosphere, an argon atmosphere, a krypton atmosphere, or a nitrogen atmosphere.

In an embodiment, the base plate is an anode base plate, and before preparing the quantum dots light-emitting layer, the method further includes step of preparing a hole functional layer on an anode surface of the base plate.

In an embodiment, the base plate is an anode base plate, and before preparing the quantum dots light-emitting layer, the method further includes steps of preparing a hole injection layer on the anode surface of the base plate, and preparing a hole transport layer on the side of the hole injection layer away from the anode.

In an embodiment, the base plate is a cathode base plate, and before preparing the quantum dots light-emitting layer, the method further includes step of preparing an electron function layer on a cathode surface of the base plate.

In an embodiment, the base plate is a cathode base plate, and before preparing the quantum dots light-emitting layer, the method further includes steps of preparing an electron injection layer on the cathode surface of the base plate, and preparing an electron transport layer on the side of the electron injection layer away from the cathode.

The method for preparing the quantum dots light-emitting diode provided in the embodiments of the present application has the beneficial effect that: changing the film-forming atmosphere of inkjet printing, and preparing the quantum dots light-emitting layer in the inert atmosphere containing active gas, which can improve the device efficiency of the quantum dots light-emitting diode while ensuring the printability of quantum dots ink.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

FIG. 1 is a flowchart schematic view of a method for preparing quantum dots light-emitting diode provided by an embodiment of present application.

DETAILED DESCRIPTION

In order to make the objectives, technical solutions, and advantages of the present application clearer, the following further describes the present application in detail with reference to the accompanying drawings and embodiments. It should be understood that the specific embodiments described here are only used to explain the present application, and are not used to limit the present application.

It should be noted that the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features. In the description of the present application, "multiple" means two or more than two, unless otherwise specifically defined.

As shown in FIG. 1, embodiments of the present application provide a method for preparing the quantum dots light-emitting diode, which includes the following step:

S01: providing a base plate, placing the base plate into an inert atmosphere containing active gas, and printing quantum dots ink on a surface of the base plate to prepare a quantum dots light-emitting layer.

The method for preparing the quantum dots light-emitting diode provided in the present application changes the film-forming atmosphere of inkjet printing, and prepares the quantum dots light-emitting layer in the inert atmosphere containing active gas, which can improve the device efficiency of the quantum dots light-emitting diode while ensuring the printability of quantum dots ink.

Specifically, the quantum dots light-emitting diodes are divided into a positive structure and an inverse structure. The positive structure includes an anode and a cathode stacked arranged, and a quantum dots light-emitting layer arranged between the anode and the cathode. The anode of the positive structure is arranged on the base plate, and hole functional layers such as the hole injection layer, the hole injection layer, and the electron blocking layer and so on can also be arranged between the anode and the quantum dots light-emitting layer, and hole functional layers such as the electron transport layer, the electron injection layer, and the hole blocking layer and so on can also be arranged between the cathode and the quantum dots light-emitting layer. The inverse structure includes an anode and a cathode stacked arranged, and a quantum dots light-emitting layer arranged between the anode and the cathode. The anode of the inverse structure is arranged on the base plate, and hole functional layers such as the hole injection layer, the hole injection layer, and the electron blocking layer and so on can also be arranged between the anode and the quantum dots light-emitting layer, and hole functional layers such as the electron transport layer, the electron injection layer, and the hole blocking layer and so on can also be arranged between the cathode and the quantum dots light-emitting layer.

In the above step S01, for the positive structure device, the bottom electrode provided on the substrate is the anode. In an embodiment of the present application, the base plate may be the bottom electrode provided on the substrate; in another embodiment of the present application, the base plate may include a substrate, a bottom electrode stacked on the surface of the substrate, a hole transport layer stacked on the surface of the substrate; in another embodiment of the present application, the base plate may include a substrate, a bottom electrode stacked on the surface of the substrate, and a hole injection layer stacked on the surface of the substrate, and a hole transport layer stacked on the surface of the hole injection layer; in another embodiment of the present application, the base plate may include a substrate, a bottom electrode stacked on the surface of the substrate, a hole injection layer stacked on the surface of the substrate, a hole transport layer stacked on the surface of the hole injection layer, and an electron blocking layer stacked on the surface of the hole transport layer.

Regarding to the inverse structure device, the bottom electrode provided on the substrate is a cathode. In an embodiment of the present application, the base plate can provide a bottom electrode on the substrate; in another embodiment of the present application, the base plate may include a substrate, a bottom electrode stacked on the surface of the substrate, and an electron transport layer stacked on the surface of the substrate; in another embodiment of the present application, the base plate may include a substrate, a bottom electrode stacked on the surface of the substrate, an electron injection layer stacked on the surface of the substrate, a hole transport layer stacked on the surface of the electron injection layer. a hole transport layer stacked on the surface of the electron injection layer; in another embodiment of the present application, the base plate may include a substrate, a bottom electrode stacked on the surface of the substrate, an electron injection layer stacked on the surface of the substrate, an electron transport layer stacked on the surface of the electron injection layer, and a hole blocking layer stacked on the surface of the electron transport layer The selection of the substrate is not strictly limited, and a rigid substrate such as a glass substrate can be used; a flexible substrate such as a polyimide substrate and a polynorbomene substrate can also be used, but it is not limited thereto.

The bottom electrode is an electrode opposite to the top electrode, and the bottom electrode may be a cathode or an anode. Specifically, when the bottom electrode is an anode, the top electrode is a cathode; when the bottom electrode is a cathode, the top electrode is an anode.

After completing the step of preparing the quantum dots light-emitting layer on the surface of the base plate in the embodiment of the present application, it further includes a step of stacking and forming other functional layers. For example, in an embodiment, for a positive device, it further includes a step of forming an electron transport layer on the surface of the quantum dots light-emitting layer, and forming a top electrode (cathode) on the surface of the electron transport layer. For example, in an embodiment, for an inverse structure device, it further includes a step of forming a hole transport layer on the surface of the quantum dots light-emitting layer, and forming a top electrode (anode) on the surface of the hole transport layer.

In some embodiments, the anode may be made of ITO, but it is not limited thereto. In some embodiments, the cathode may be a metal electrode, including but not limited to a silver electrode or an aluminum electrode. The thickness of the cathode is 60-120 nm, and is specifically preferably 100 nm.

The base plate is placed in the inert atmosphere containing reactive gas, which changes the atmosphere of inkjet printing, and prepares the quantum dots light-emitting layer in the inert atmosphere containing reactive gas can improve the device efficiency of the quantum dots light-emitting diode while ensuring the printability of quantum dots ink.

In some embodiments, the active gas is one or a combination of two or more selected from a group consisting of saturated fatty acids, unsaturated fatty acids, esters, and organic bases. Due to its special structural properties, this type of active gas is beneficial to the improvement of the properties of the functional layers, and is an effective solution for improving the external quantum efficiency of QLED devices.

In some embodiments, the saturated fatty acid is selected from a group consisting of butyric acid, caprylic acid, lauric acid, and stearic acid. In some embodiments, the unsaturated fatty acid is selected from a group consisting of acrylic acid, crotonic acid, methacrylic acid, and 3-pentenoic acid. In some embodiments, the ester is selected from a group consisting of methyl methacrylate, ethyl crotonate, ethyl acetate, and methyl benzoate. In some embodiments, the organic base is selected from a group consisting of ethanolamine, tetramethylammonium hydroxide, aniline, and triethanolamine.

In some embodiments, the reactive gas is a combination of two or more selected from a group consisting of the saturated fatty acids, the unsaturated fatty acids, the esters, and the organic bases. In some specific embodiments, the active gas is a mixed active gas composed of at least one selected from unsaturated fatty acids and at least one selected from the organic bases.

On the basis of the foregoing embodiments, the reactive gas accounts for 0.001%-20% of the molar percentage of the overall gas atmosphere. If the content of the active gas is too high, higher than 20%, the quantum dots in the quantum dots light-emitting layer will be quenched, which will affect the light-emitting performance of the quantum dots. In some embodiments of the present application, the reactive gas accounts for less than 10% of the molar percentage of the overall gas atmosphere, so that the quantum dots light-emitting layer prepared by inkjet printing has both good printability and light-emitting performance.

When the reactive gas is selected from two or more reactive gases of different types, all the reactive gases account for 0.0001%-20% of the total molar percentage of the overall gas atmosphere. In some embodiments of the present application, the reactive gas accounts for 0.01%-15% of the molar percentage of the overall gas atmosphere. In some embodiments of the present application, the reactive gas accounts for 0.1%-10% of the molar percentage of the overall gas atmosphere. In some embodiments of the present application, the reactive gas accounts for 0.1%-3% of the molar percentage of the overall gas atmosphere.

In the embodiments of the present application, the method for printing quantum dots ink on the surface of the substrate adopts a conventional inkjet printing method, and the quantum dots ink adopts conventional quantum dot ink, which is not limited here.

The steps of placing the base plate into an inert atmosphere containing active gas, and printing quantum dots ink on a surface of the base plate to prepare a quantum dots light-emitting layer are performed under a condition of a temperature ranged from 10° C. to 80° C., the effect of the active gas in improving the light-emitting performance of the quantum dot light-emitting layer can be improved. Specifically, the temperature for preparing the quantum dots light-emitting layer is determined according to the type of active gas selected, the higher the boiling point of the reactive gas, the higher the temperature for preparing the quantum dots light-emitting layer. In some embodiments of the present application, it is performed under the condition of a temperature of 30° C-50° C., and the quantum dots ink is printed on the surface of the substrate to prepare the quantum dots light-emitting layer, which can obtain a better effect of improving the light-emitting performance of the quantum dot light-emitting layer.

In the embodiment of the present application, the inert atmosphere is a helium atmosphere, a neon atmosphere, an argon atmosphere, a krypton atmosphere, or a nitrogen atmosphere.

The top electrode is prepared on the surface of the quantum dots light-emitting layer away from the bottom electrode, which can be prepared by the conventional methods in the art. It is noted that the top electrode described in the embodiment of the present application is an electrode opposite to the bottom electrode, and specifically may be an anode or a cathode.

Thus, the embodiments of the present application prepare the quantum dots light-emitting diode with a basic structure (including a cathode and an anode disposed oppositely, and the quantum dots light-emitting layer disposed between the cathode and the anode). In order to obtain better device performance, the functional layers with different roles can be introduced on the basic structure of the quantum dots light-emitting diode to balance carriers.

In some embodiments, when the bottom electrode is an anode, that is, when the anode is set on the base plate to form an anode base plate, before preparing the quantum dots light-emitting layer, it further includes the step of preparing a hole functional layer on the anode surface of the base plate (the hole functional layer is disposed between the anode and the quantum dots light-emitting layer). The hole functional layer comprises at least one layer selected from a group consisting of a hole injection layer, a hole transport layer, and an electron blocking layer. Among them, the hole injection layer and the hole transport layer are used to reduce the difficulty of hole injection, and the electron blocking layer is used to block excess electrons so that the excess electrons cannot reach the anode to form a leakage current, thereby improving the current efficiency of the quantum dot light emitting diode. As a specific preferred embodiment, when the anode is disposed on the base plate to form an anode base plate, before preparing the quantum dots light-emitting layer, the method further includes the steps of preparing a hole injection layer on the anode surface of the base plate, and preparing a hole transport layer on the side of the hole injection layer away from the anode. Among them, the material of the hole injection layer can be a conventional hole injection material, including but not limited to PEDOT:PSS. The material of the hole transport layer can be conventional hole transport materials, including but not limited to organic materials such as NPB and TFB, and inorganic materials such as NiO, MoO$_3$ and their composites. The thickness of the hole transport layer is ranged from 10 to 100 nm.

In some embodiments, when the bottom electrode is an anode, that is, when the anode is disposed on the base plate to form an anode base plate, after preparing the quantum dots light-emitting layer and before preparing the cathode, the method further includes the step of preparing an electron function layer (the electron function layer is arranged between the cathode and the quantum dots light-emitting layer) on one side of the quantum dots light-emitting layer away from the anode. The electron function layer includes at least one of an electron injection layer, an electron transport layer, and a hole blocking layer. Among them, the electron injection layer and the electron transport layer are used to reduce the difficulty of electron injection, and the hole blocking layer is used to block excess holes so that the excess holes cannot reach the cathode to form a leakage current, thereby improving the current efficiency of the quantum dots light-emitting diode. As a specific preferred embodiment, when the anode is disposed on the base plate to form the anode base plate, after the quantum dots light-emitting layer is prepared, and before the cathode is prepared, the method further includes the step of preparing an electron transport layer on the side of the quantum dot light-emitting layer away from the anode, and preparing an electron injection layer on the side of the electron injection layer away from the anode. Among them, the material of the electron injection layer can be a conventional electron hole injection material, including but not limited to LiF, CsF, and the thickness of the electron transport layer is ranged from 10 to100 nm. The material of the electron transport layer can be a conventional electron transport material, including but not limited to n-type zinc oxide, and the thickness of the electron transport layer is ranged from 10 to 100 nm.

In some embodiments, when the bottom electrode is a cathode, that is, when the cathode is disposed on the base plate to form a cathode base plate, before preparing the quantum dots light-emitting layer, the step of preparing an electron function layer on the cathode surface of the base plate is further included. The electron function layer includes at least one layer selected from a group consisting of an electron injection layer, an electron transport layer, and a hole blocking layer. As a specific preferred embodiment, when the cathode is disposed on the base plate to form the cathode base plate, and before preparing the quantum dots light-emitting layer, the method further includes the steps of preparing the electron injection layer on the cathode surface of the base plate, and preparing the electron transport layer on the side of the electron injection layer away from the cathode.

In some embodiments, when the bottom electrode is a cathode, that is, when the cathode is disposed on the base plate to form a cathode base plate, after preparing the quantum dots light-emitting layer and before preparing the anode, the method further includes the step of preparing a hole functional layer on one side of the quantum dots light-emitting layer away from the cathode. The hole function layer includes at least one of a hole injection layer, a hole transport layer, and an electron blocking layer. In some embodiments of the present application, when the cathode is disposed on the base plate to form the cathode base plate, after preparing the quantum dots light-emitting layer and before preparing the anode, the method further includes the steps of preparing the hole transport layer on the side of the quantum dots light-emitting layer away from the cathode, and preparing the hole injection layer on the side of the hole transport layer away from the cathode.

For the preparation of the above-mentioned electron function layer and hole functional layer, refer to the preparation of conventional methods in the art. In some embodiments of the present application, the solution processing method is adopted to obtain the preparation.

The description will be given below in conjunction with specific embodiments.

Embodiment 1

A method for preparing the quantum dots light-emitting diode includes the following steps:

providing a glass base plate provided with an anode (ITO), placing the base plate in the inert atmosphere containing acrylic acid and ethanolamine, and printing quantum dots ink on the surface of the base plate under the condition of an ambient temperature of 40° C. to prepare a quantum dots light-emitting layer (CdSe/ZnS QDs); where the acrylic acid accounts for 0.1% of the molar percentage, and the ethanolamine accounts for 0.2% of the molar percentage;

preparing the electron transport layer (ZnO) on the surface of the quantum dots light-emitting layer away from the anode, preparing the electron injection layer (LiF) on the surface of the electron transport layer away from the anode, and preparing the aluminum cathode on the surface of the electron injection layer away from the anode.

Embodiment 2

A method for preparing the quantum dots light-emitting diode, the difference from embodiment 1 is that the acrylic acid accounts for 0.05% of the molar percentage, and the ethanolamine accounts for 0.1% of the molar percentage.

Embodiment 3

A method for preparing the quantum dots light-emitting diode, the difference from embodiment 1 is that the acrylic acid accounts for 0.025% of the molar percentage, and the ethanolamine accounts for 0.05% of the molar percentage.

COMPARATIVE EXAMPLE 1

A method for preparing the quantum dots light-emitting diode includes the following steps:

providing a glass base plate provided with an anode (ITO), printing quantum dots ink on the surface of the base plate under the condition of an ambient temperature of 40° C. to prepare a quantum dots light-emitting layer (CdSe/ZnS QDs);

preparing the electron transport layer (ZnO) on the surface of the quantum dots light-emitting layer away from the anode, preparing the electron injection layer (LiF) on the surface of the electron transport layer away from the anode, and preparing the aluminum cathode on the surface of the electron injection layer away from the anode.

The changes (%) of the external quantum efficiency of the quantum dots light-emitting diodes prepared in embodiments 1-3 and Comparative Example 1 are respectively tested after energization and curing, and the results are shown in Table 1 below.

TABLE 1

| External quantum efficiency (%) | 1 day later | 2 days later | 3 days later | 4 days later |
|---|---|---|---|---|
| Embodiment 1 | 3.7 | 6.1 | 7.0 | 6.5 |
| Embodiment 2 | 3.6 | 5.7 | 7.2 | 6.8 |
| Embodiment 3 | 3.7 | 5.5 | 6.9 | 6.4 |
| Comparative example 1 | 3.0 | 4.7 | 5.9 | 2.2 |

It can be seen from Table 1 above that when compared to the quantum dots light-emitting diode devices that are not treated with acrylic acid and ethanolamine active gas in preparing the quantum dots light-emitting diode through the ink-jet printing, the external quantum efficiencies of the devices treated with acrylic acid and ethanolamine in embodiments 1-3 of the present application are generally effectively improved, and when the molar percentages of the acrylic acid and ethanolamine in the overall atmosphere are respectively 0.05% and 0.1%, the external quantum efficiency increases the most.

Embodiment 4

A method for preparing the quantum dots light-emitting diode includes the following steps:
providing a glass base plate provided with an anode (ITO), placing the base plate in the inert atmosphere containing acrylic acid and ethanolamine, and printing quantum dots ink on the surface of the base plate under the condition of an ambient temperature of 30° C. to prepare a quantum dots light-emitting layer (CdSe/ZnS QDs); where the acrylic acid accounts for 0.05% of the molar percentage, and the ethanolamine accounts for 0.1% of the molar percentage;
preparing the electron transport layer (ZnO) on the surface of the quantum dots light-emitting layer away from the anode, preparing the electron injection layer (LiF) on the surface of the electron transport layer away from the anode, and preparing the aluminum cathode on the surface of the electron injection layer away from the anode.

Embodiment 5

A method for preparing the quantum dots light-emitting diode, the difference from embodiment 4 is that printing quantum dots ink on the surface of the base plate under the condition of an ambient temperature of 40° C. to prepare a quantum dots light-emitting layer (CdSe/ZnS QDs); where the acrylic acid accounts for 0.05% of the molar percentage, and the ethanolamine accounts for 0.1% of the molar percentage.

Embodiment 6

A method for preparing the quantum dots light-emitting diode, the difference from embodiment 4 is that printing quantum dots ink on the surface of the base plate under the condition of an ambient temperature of 50° C. to prepare a quantum dots light-emitting layer (CdSe/ZnS QDs); where the acrylic acid accounts for 0.05% of the molar percentage, and the ethanolamine accounts for 0.1% of the molar percentage.

Embodiment 7

A method for preparing the quantum dots light-emitting diode, the difference from embodiment 4 is that printing quantum dots ink on the surface of the base plate under the condition of an ambient temperature of 60° C. to prepare a quantum dots light-emitting layer (CdSe/ZnS QDs); where the acrylic acid accounts for 0.05% of the molar percentage, and the ethanolamine accounts for 0.1% of the molar percentage.

Embodiment 8

A method for preparing the quantum dots light-emitting diode, the difference from embodiment 4 is that printing quantum dots ink on the surface of the base plate under the condition of an ambient temperature of 70° C. to prepare a quantum dots light-emitting layer (CdSe/ZnS QDs); where the acrylic acid accounts for 0.05% of the molar percentage, and the ethanolamine accounts for 0.1% of the molar percentage.

COMPARATIVE EXAMPLE 2

A method for preparing the quantum dots light-emitting diode includes the following steps:
providing a glass base plate provided with an anode (ITO), printing quantum dots ink on the surface of the base plate under the condition of an ambient temperature of 30° C. to prepare a quantum dots light-emitting layer (CdSe/ZnS QDs);
preparing the electron transport layer (ZnO) on the surface of the quantum dots light-emitting layer away from the anode, preparing the electron injection layer (LiF) on the surface of the electron transport layer away from the anode, and preparing the aluminum cathode on the surface of the electron injection layer away from the anode.

COMPARATIVE EXAMPLE 3

A method for preparing the quantum dots light-emitting diode, the difference from comparative example 2 is that printing quantum dots ink on the surface of the base plate under the condition of an ambient temperature of 40° C. to prepare a quantum dots light-emitting layer (CdSe/ZnS QDs).

COMPARATIVE EXAMPLE 4

A method for preparing the quantum dots light-emitting diode, the difference from comparative example 2 is that printing quantum dots ink on the surface of the base plate under the condition of an ambient temperature of 50° C. to prepare a quantum dots light-emitting layer (CdSe/ZnS QDs).

COMPARATIVE EXAMPLE 5

A method for preparing the quantum dots light-emitting diode, the difference from comparative example 2 is that printing quantum dots ink on the surface of the base plate under the condition of an ambient temperature of 60° C. to prepare a quantum dots light-emitting layer (CdSe/ZnS QDs).

COMPARATIVE EXAMPLE 6

A method for preparing the quantum dots light-emitting diode, the difference from comparative example 2 is that printing quantum dots ink on the surface of the base plate under the condition of an ambient temperature of 70° C. to prepare a quantum dots light-emitting layer (CdSe/ZnS QDs).

The device lifetimes (T50@100nits~hrs) of the quantum dots light-emitting diodes of embodiments 4-8 and comparative examples 2-6 are tested respectively, as shown in Table 2 below.

TABLE 2

| device lifetime (h) | temperature (° C.) | | | | |
|---|---|---|---|---|---|
| | 30 | 40 | 50 | 60 | 70 |
| Embodiment 4 | 360 | — | — | — | — |
| Embodiment 5 | — | 403 | — | — | — |
| Embodiment 6 | — | — | 356 | — | — |
| Embodiment 7 | — | — | — | 334 | — |
| Embodiment 8 | — | — | — | — | 301 |
| comparative example 2 | 315 | — | — | — | — |
| comparative example 3 | — | 357 | — | — | — |
| comparative example 4 | — | — | 281 | — | — |
| comparative example 5 | — | — | — | 263 | — |
| comparative example 6 | — | — | — | — | 240 |

It can be seen from Table 2 above that when the quantum dots light-emitting layer is prepared by the same inkjet printing method under the same temperature conditions, the device lifetimes of the quantum dot light-emitting diodes treated with the acrylic acid and ethanolamine active gas are improved. However, in embodiments 4-8, when dried at a low temperature of 40° C., the device lifetimes are longer.

The above are only optional embodiments of the present application, and are not used to limit the present application. For those skilled in the art, the present application can have various modifications and changes. Any modification, equivalent replacement, improvement, etc. made within the spirit and principle of the present application shall be included in the scope of the claims of the present application.

What is claimed is:

1. A method for preparing quantum dots light-emitting diode, comprising following step:
   providing a base plate, placing the base plate into an inert atmosphere containing active gas, and printing quantum dots ink on a surface of the base plate to prepare a quantum dots light-emitting layer.

2. The method of claim 1, wherein the active gas is one or a combination of two or more selected from a group consisting of saturated fatty acids, unsaturated fatty acids, esters, and organic bases.

3. The method of claim 2, wherein the saturated fatty acid is selected from a group consisting of butyric acid, caprylic acid, lauric acid, and stearic acid.

4. The method of claim 2, wherein the unsaturated fatty acid is selected from a group consisting of acrylic acid, crotonic acid, methacrylic acid, and 3-pentenoic acid.

5. The method of claim 2, wherein the ester is selected from a group consisting of methyl methacrylate, ethyl crotonate, ethyl acetate, and methyl benzoate.

6. The method of claim 2, wherein the organic base is selected from a group consisting of ethanolamine, tetramethylammonium hydroxide, aniline, and triethanolamine.

7. The method of claim 1, wherein the active gas accounts for 0.01%-20% of a molar percentage of the overall gas atmosphere.

8. The method of claim 1, wherein the active gas accounts for 0.01%-15% of a molar percentage of the overall gas atmosphere.

9. The method of claim 8, wherein the active gas accounts for 0.1%-3% of a molar percentage of the overall gas atmosphere.

10. The method of any one of claim 1, wherein the active gas is a combination of two or more selected from a group consisting of the saturated fatty acids, the unsaturated fatty acids, the esters, and the organic bases.

11. The method of claim 10, wherein the active gas is a mixed active gas composed of at least one selected from unsaturated fatty acids and at least one selected from the organic bases.

12. The method of any one of claim 1, wherein the steps of placing the base plate into an inert atmosphere containing active gas, and printing quantum dots ink on a surface of the base plate to prepare a quantum dots light-emitting layer are performed under a condition of a temperature ranged from 10° C. to 80° C.

13. The method of claim 12, wherein the steps of placing the base plate into an inert atmosphere containing active gas, and printing quantum dots ink on a surface of the base plate to prepare a quantum dots light-emitting layer are performed under a condition of a temperature ranged from 30° C. to 50° C.

14. The method of claim 1, wherein the inert atmosphere is a helium atmosphere, a neon atmosphere, an argon atmosphere, a krypton atmosphere, or a nitrogen atmosphere.

15. The method of claim 1, wherein the base plate is an anode base plate, and before preparing the quantum dots light-emitting layer, the method further comprises step of preparing a hole functional layer on an anode surface of the base plate.

16. The method of claim 15, wherein the base plate is an anode base plate, and before preparing the quantum dots light-emitting layer, the method further comprises steps of preparing a hole injection layer on the anode surface of the base plate, and preparing a hole transport layer on the side of the hole injection layer away from the anode.

17. The method of claim 1, wherein the base plate is a cathode base plate, and before preparing the quantum dots light-emitting layer, the method further comprises step of preparing an electron function layer on a cathode surface of the base plate.

18. The method of claim 17, wherein the base plate is a cathode base plate, and before preparing the quantum dots light-emitting layer, the method further comprises steps of preparing an electron injection layer on the cathode surface of the base plate, and preparing an electron transport layer on the side of the electron injection layer away from the cathode.

* * * * *